United States Patent [19]

Peach

[11] Patent Number: 4,733,207
[45] Date of Patent: Mar. 22, 1988

[54] SURFACE ACOUSTIC WAVE FILTERS

[75] Inventor: Robert C. Peach, Watford, England

[73] Assignee: The General Electric Company, p.l.c., England

[21] Appl. No.: 62,090

[22] Filed: Jun. 12, 1987

[30] Foreign Application Priority Data

Jun. 25, 1986 [GB] United Kingdom ............... 8615522

[51] Int. Cl.$^4$ ............................................... H03H 9/64
[52] U.S. Cl. .................................... 333/193; 310/313 C; 333/194; 333/196
[58] Field of Search .......................... 333/150–155, 333/193–196; 310/313 R, 313 A, 313 B, 313 C, 313 D

[56] References Cited

U.S. PATENT DOCUMENTS 3,727,155  4/1973  De Vries ........................... 333/194
4,575,696  3/1986  Hartmann et al. ................ 333/154

Primary Examiner—Marvin L. Nussbaum
Attorney, Agent, or Firm—Kirschstein, Kirschstein, Ottinger & Israel

[57] ABSTRACT

A surface acoustic wave filter comprising; a first bidirectional ID transducer (5) of symmetrical form; a second ID transducer (1) acoustically coupled with the first transducer and comprising two parts (1A, 1B) each of which parts is in the form of one half of a respective bidirectional ID transducer (9 or 11) of symmetrical form, the two parts being positioned with respect to one another and the first transducer so that when respectively excited by corresponding signals of different phases they co-operate to produce a unidirectional acoustic signal propagating towards the first transducer from one side thereof; and a third transducer (3) acoustically coupled with the first transducer and comprising two parts (3A, 3B ), each of which parts is electrically connected in parallel with a respective one of the two parts of said second transducer, and each of which parts of the third transducer is effectively in the form of the mirror image about the center line (7) of the first transducer of the other half of the bidirectional transducer whose one half constitutes the part of the second transducer with which it is connected. The invention provides a filter of intrinsically low insertion loss without the use of a cross-over structure as it required in known forms of low loss filter using undirectional multiphase ID transducers.

9 Claims, 5 Drawing Figures

SURFACE ACOUSTIC WAVE FILTERS

This invention relates to surface acoustic wave (SAW) filters of the kind employing interdigital (ID) transducers.

A conventional SAW filter employing a bidirectional ID input transducer and a bidirectional ID output transducer has an intrinsic bidirectional insertion loss of 6 dB. However, if the input and output transducers are closely impedance matched to obtain an actual insertion loss close to 6 dB, multiple transit echoes reach unacceptable proportions. Consequently, such filters are in practice poorly matched to source and load and typically exhibit an actual insertion loss of 20 to 30 dB.

To reduce insertion loss it has been proposed to use unidirectional multiphase ID transducers so that bidirectional loss is eliminated and the transducers may be closely matched to source and load without introducing multiple transit echoes. Known forms of unidirectional multiphase ID transducers suitable for such use, however, are relatively expensive to fabricate since they require the presence of a crossover structure within the transducer ID structure, so that a multilayer fabrication process e.g. a two-stage metal layer deposition process, is required to form the transducer ID structure. Furthermore, three inductors are required in the tuning circuitry for a multiphase ID transducer as opposed to one for an ordinary bidirectional ID transducer.

As a result, designers frequently opt to use a filter utilising bidirectional transducers and compensate for the resulting relatively high insertion loss by the use of additional amplification.

It is an object of the present invention to provide a SAW filter exhibiting an intrinsically low insertion loss which is of such a form as to be capable of being fabricated without the use of a multilayer fabrication process.

According to the present invention there is provided a SAW filter comprising: a first bidirectional ID transducer of symmetrical form; a second ID transducer acoustically coupled with the first transducer and comprising two parts each of which parts is in the form of one half of a respective bidirectional ID transducer of symmetrical form, the two parts being positioned with respect to one another and the first transducer so that when respectively excited by corresponding signals of different phases they co-operate to produce a unidirectional acoustic signal propagating towards the first transducer from one side thereof; and a third transducer acoustically coupled with the first transducer and comprising two parts, each of which parts is electrically connected in parallel with a respective one of the two parts of said second transducer, and each of which parts of the third transducer is effectively in the form of a mirror image about the centre line of the first transducer of the other half of the bidirectional transducer whose one half constitutes the part of the second transducer with which it is connected.

Preferably said two parts of said second transducer are spaced apart by an amount such that they co-operate to produce said unidirectional acoustic signal when respectively excited by signals in quadrature phase relationship.

In one particular embodiment of the invention said transducers are of the split finger type.

By a transducer of symmetrical form is meant a transducer in which the electrode structure is symmetric or anti-symmetric about its centre line and any weighting incorporated in the transducer is symmetric about its centre line.

One SAW filter in accordance with the invention will now be described, by way of example, with reference to the accompanying drawings in which.

Figure 1:
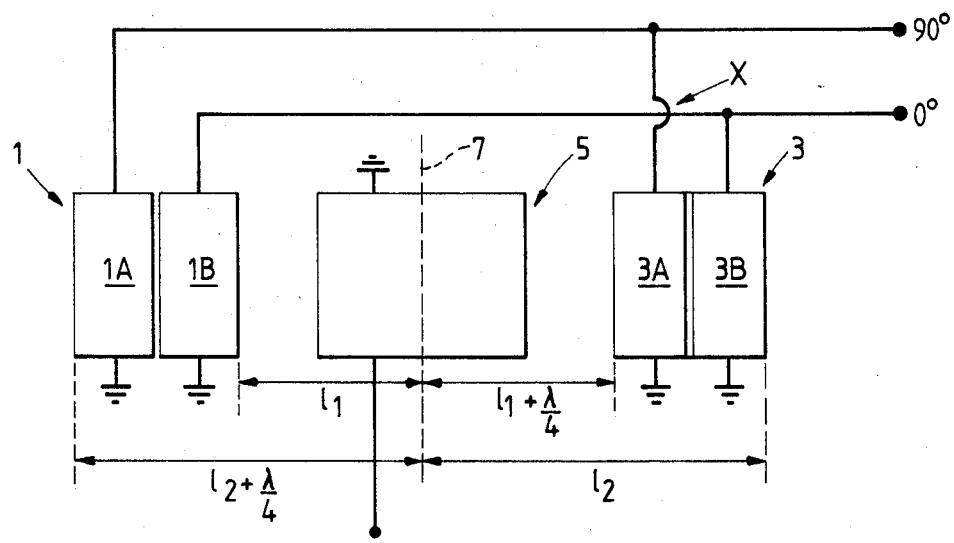
FIG. 1 is a schematic diagram of the filter.

Referring to FIG. 1, the filter comprises a substrate (not shown) of a suitable piezoelectric material, such as lithium niobate or quartz, on one main face of which there are provided two launching interdigital transducers 1 and 3 positioned one on either side of a detecting interdigital transducer 5, and acoustically coupled therewith via the substrate.

The fingers of the transducer 5 are arranged symmetrically about the centre line 7 of the transducer 5 so that the transducer 5 is bidirectional, i.e. it responds identically to an acoustic signal whether the signal is directed towards the transducer from one side or the other.

The transducers 1 and 3 are both arranged to launch acoustic signals only in a direction towards the transducer 5, i.e. to operate as unidirectional transducers.

To this end the transducer 1 comprises two parts 1A and 1B and the transducer 3 comprises two parts 3A and 3B.

Figure 2:
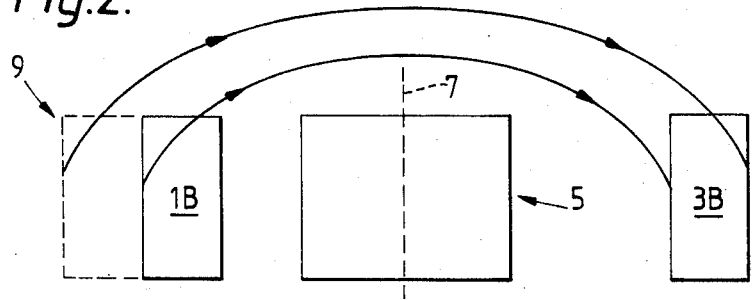
FIGS. 2 and 3 are diagrams illustrating features of the design of the filter of FIG. 1.

Referring to FIG. 2, the right hand part 1B of the transducer 1 is constituted by the right hand half of a notional bidirectional symmetrical transducer 9, and the right hand part 3B of the transducer 3 is constituted by the mirror image about the centre line 7 of the transducer 5 of the left hand half of the transducer 9.

Figure 3:
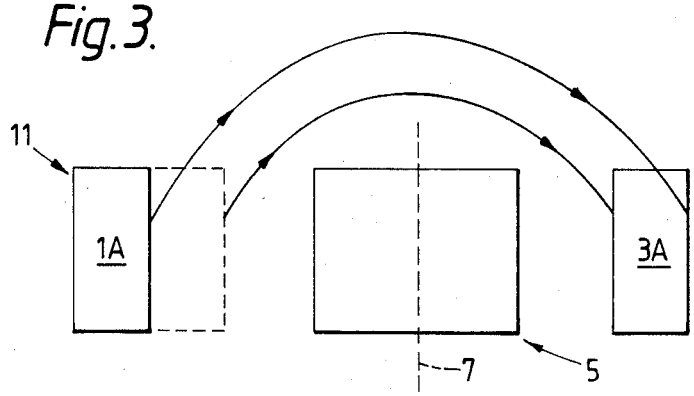

Similarly, referring to FIG. 3, the left hand part 1A of the transducer 1 is constituted by the left hand half of a notional bidirectional symmetrical transducer 11, and the left hand part 3A of the transducer 3 is constituted by the mirror image about the centre line 7 of the transducer 5 of the right hand half of the transducer 11.

The two parts 1A and 1B of the transducer 1 are spaced apart by a distance equal to one quarter of the wavelength of an acoustic wave in the substrate at the centre frequency of the filter and in operation the signal applied to the left hand part 1A leads the signal applied to the right hand part by 90°. Consequently the signals launched in a direction towards the transducer 5 by the two parts 1A and 1B add together whilst the signals launched in a direction away from the transducer 5 cancel.

The parts 3A and 3B of the transducer 3 are respectively electrically connected in parallel with the parts 1A and 1B of the transducer 1 so that the signal applied to the part 3A leads the signal applied to the part 3B by 90°. Consequently, and by virtue of the fact that due to their spatial relation to the parts 1A and 1B respectively the parts 3A and 3B overlap by one quarter of a wavelength, the signals launched by the two parts 3A and 3B towards the transducer 5 add together whilst the signals launched in a direction away from the transducer 5 cancel.

Hence, in operation both of the transducers 1 and 3 operate unidirectionally at the filter centre frequency so that the filter exhibits zero intrinsic loss. At the same time, since the transducer parts 1A and 3A together and the transducer parts 1B and 3B together each effectively comprise a bidirectional transducer, the filter exhibits a frequency response equivalent to that obtained with a filter comprising a bidirectional launching transducer and a bidirectional detecting transducer.

Although each of the transducers 1 and 3 is only fully unidirectional at the filter centre frequency, the problem of multiple transit signals does not arise because, as illustrated by the dimensions shown in FIG. 1, the transducer parts 1A and 3A form a unit which is displaced by a quarter wavelength with respect to a unit formed by transducer parts 1B and 3B in so far as signals reflected to the transducer 5 are concerned. The two units 1A, 3A and 1B, 3B therefore produce reflected signals at the transducer 5 which are in antiphase, and therefore cancel and produce no effect, the cancellation being broad band and similar to that obtained with known multiphase ID transducer filter devices.

The device thus exhibits an intrinsic performance comparable to known multiphase ID transducer filter devices. However, the device of FIG. 1 incorporates no crossovers in its interdigital structure and can thus be fabricated using a single stage of metal deposition. It is pointed out in this connection that a crossover may still be required in the leads to the transducer, as at point X in FIG. 1, but this can easily be provided by a flying lead bonded between pads on the substrate, or by a crossover connection on a board used for mounting components of a tuning network for the filter.

Figure 4:
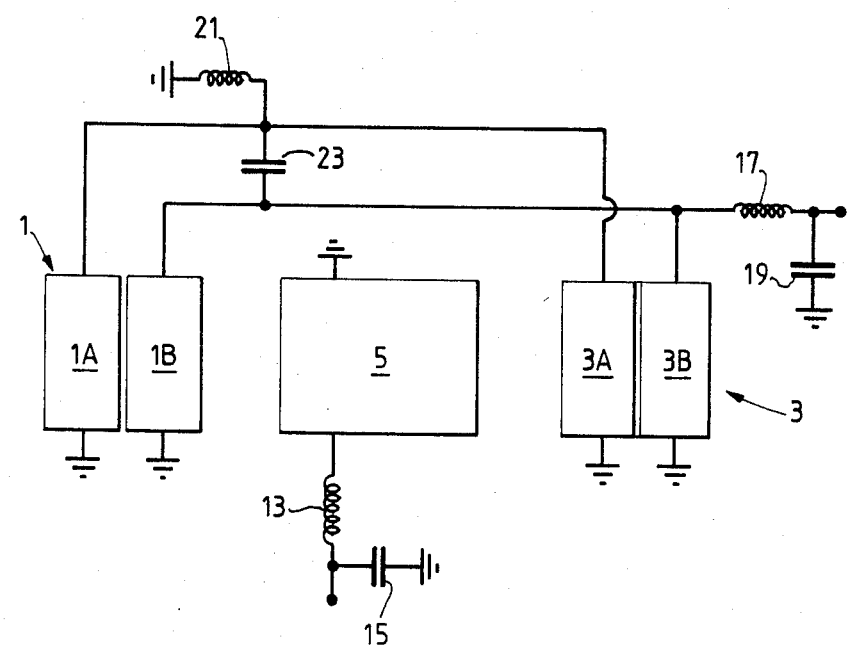
FIG. 4 is a schematic diagram illustrating a tuning network for the filter of FIG. 1.

In use of the filter of FIG. 1 the required tuning network is suitably of the form shown in FIG. 4. The central transducer 5 is impedance matched by an inductor 13 connected in series between one set of fingers of the transducer 5 and a load (not shown) and a capacitor 15 connected between the load end of the inductor 13 and the other set of fingers of the transducer 5, which set of fingers is normally earthed.

The two transducers 1 and 3 are similarly matched to a signal source (not shown) by an inductor 17 and a capacitor 19, and a further inductor 21 and capacitor 23 provide the required 90° phase shift between the signals applied to the two parts of each of the transducers 1 and 3.

Under some impedance matching conditions, one or other or both of the capacitors 15 and 19 may be connected to the other end of the associated inductor 13 or 17.

In known filters using multiphase ID transducers each of the two transducers typically uses a tuning network of the general form shown in FIG. 4 for transducers 1 and 3. However, in multiphase ID transducers the intrinsic capacitance between the points between which the capacitor corresponding to the phase shift capacitor 23 of FIG. 4 is required to be connected is normally much higher than the required value of the phase shift capacitor. Consequently, an inductor is needed to obtain the required 90° input signal phase difference rather than a capacitor. Hence a filter using multiphase ID transducers typically uses three inductors in the tuning network for each transducer, that is a total of six inductors in its tuning network. Thus, in practice, the filter of FIG. 1 has the further advantage over a unidirectional multiphase transducer filter arrangement that three fewer inductors are required in the tuning network.

Furthermore, the filter of FIG. 1 uses only one more inductor in its tuning network than does a filter using bidirectional ID transducers.

It will be appreciated that various electrode geometries may be used in the filter of FIG. 1. However, the most satisfactory geometry is likely to be a conventional split finger geometry with four fingers per acoustic wavelength, i.e. with the width of each finger and the spacing between adjacent fingers equal to one eighth of the wavelength of an acoustic wave in the substrate at the centre frequency of the filter.

Figure 5:
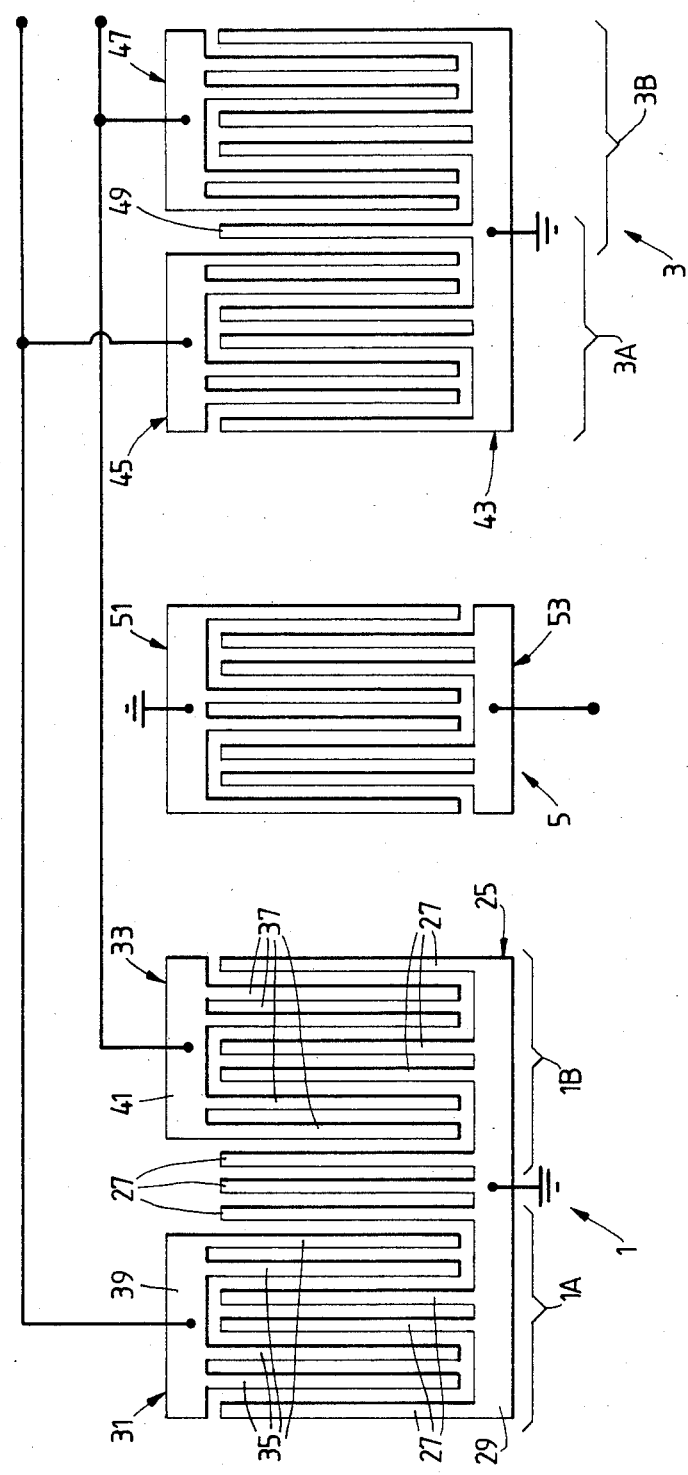
FIG. 5 is a diagram illustrating a practical realisation of the filter of FIG. 1.

FIG. 5 illustrates a practical embodiment of the filter of FIG. 1 using such a geometry.

In FIG. 5, the transducer 1 comprises a first metal electrode 25 having a set of parallel spaced apart fingers 27 which extend from a metallised area 29 which electrically connects the fingers 27 at one end, and constitutes a common terminal for the two parts 1A and 1B of the transducer 1.

The transducer 1 further comprises second and third metal electrodes 31 and 33 each having a set of parallel spaced apart fingers 35 or 37 which extend from a respective metallised area 39 or 41, the areas 39 and 41 respectively constituting the other terminals of the two parts 1A and 1B of the transducer 1.

In each of the electrodes 31 and 33 the fingers 35 or 37 are arranged in pairs, with pairs of fingers 27 of the electrode 25 interdigitated between the pairs of fingers 35 or 37 and a single finger 27 of the electrode 25 at each end of each of the electrodes 31 and 33.

A central finger 27 of the electrode 25 is provided in the required space between the eight fingers constituting the left part 1A of the transducer 1 and the eight fingers constituting the right part 1B of the transducer 1 to equalise loading of the substrate along the length of the transducer.

The transducer 3 similarly comprises first, second and third electrodes 43, 45 and 47 the electrodes 45 and 47 being of identical form to the electrodes 31 and 33 respectively but the electrode 43 having two fewer fingers than the electrode 25 so that the central finger 49 of the electrode 43 constitutes both the right end finger of transducer part 3A and the left end finger of transducer part 3B. Hence the transducer parts 3A and 3B overlap as required.

The central transducer 5 comprises two electrodes 51 and 53 whose fingers are arranged symmetrically about the centre line of the transducer, the electrode 51 which has single fingers at its ends being earthed.

It will be appreciated that in practice the electrodes of the transducers of a filter according to the invention will normally have many more fingers than are shown in FIG. 5. In addition, although not illustrated in FIG. 5 for simplicity, in a filter in accordance with the invention finger overlap will normally vary along the length of each transducer to provide weighting and thereby confer a required frequency response on the filter.

In accordance with the invention, however, when such weighting is provided in the central transducer 5 it will be symmetric about the centre line of the central transducer. Furthermore, the weighting pattern in the notional transducer 11 comprising transducer parts 1A and 3A will be symmetric, as will the weighting pattern in the notional transducer 9 comprising transducer parts 1B and 3B. Moreover, in order for the arrangement to be fully balanced these two weighting patterns will normally be substantially identical so that, ignoring the 90° phase shifts, the weighting in transducer 1 will be substantially symmetric and identical with the weighting in transducer 3.

In this connection it is pointed out that whilst in the arrangement shown in FIG. 5 the electrode geometries of the transducers 1, 3 and 5 are symmetric about the centre lines of the respective transducers, in other arrangements in accordance with the invention transducers with anti-symmetric electrode geometries may be used. Thus, instead of the transducers being formed from a symmetric basic unit e.g. a unit comprising a pair of driven fingers between two grounded fingers, as shown in FIG. 5, the transducers may be formed from an anti-symmetric basic unit e.g. a unit comprising a pair of driven fingers alongside a pair of grounded fingers. By a grounded finger is meant a finger maintained at a fixed potential in operation.

I claim:

1. A SAW filter comprising: a first bidirectional ID transducer of symmetrical form; a second ID transducer comprising two parts each of which parts is in the form of one half of a respective bidirectional ID transducer of symmetrical form, the two parts being positioned with respect to one another and the first transducer so that when respectively excited by corresponding signals of different phases they co-operate to produce a unidirectional acoustic signal propagating towards the first transducer from one side thereof; and a third transducer acoustically coupled with the first transducer and comprising two parts, each of which parts is electrically connected in parallel with a respective one of the two parts of said second transducer, and each of which parts of the third transducer is effectively in the form of the mirror image about the centre line of the first transducer of the other half of the bidirectional transducer whose one half constitutes the part of the second transducer with which it is connected.

2. A filter according to claim 1 wherein said two parts of said second transducer are spaced apart by an amount such that they co-operate to produce said unidirectional acoustic signal when respectively excited by signals in quadrature phase relationship.

3. A filter according to claim 1 wherein said transducers are of the split finger type.

4. A filter according to claim 3 wherein said transducers have four fingers per acoustic wavelength.

5. A filter according to claim 4 wherein said transducers each comprise a plurality of units each comprising a pair of driven fingers between two fingers maintained at a fixed potential in operation.

6. A filter according to claim 4 wherein said transducers each comprise a plurality of units each comprising a pair of driven fingers alongside a pair of fingers maintained at a fixed potential in operation.

7. A filter according to claim 1 further including a tuning network comprising: an impedance matching first sub network connected with said first transducer; an impedance matching second sub network connected with said second and third transducers and a phase shifting third sub network connected with said second and third transducers.

8. A filter according to claim 7 wherein each said sub network includes only one inductor.

9. A filter according to claim 8 wherein each said sub network further includes only one capacitor.

* * * * *